(12) United States Patent
Henning et al.

(10) Patent No.: US 7,880,172 B2
(45) Date of Patent: Feb. 1, 2011

(54) TRANSISTORS HAVING IMPLANTED CHANNELS AND IMPLANTED P-TYPE REGIONS BENEATH THE SOURCE REGION

(75) Inventors: Jason P. Henning, Carrboro, NC (US); Allan Ward, Durham, NC (US); Alexander Suvorov, Durham, NC (US)

(73) Assignee: Cree, Inc., Durham, NC (US)

(*) Notice: Subject to any disclaimer, the term of this patent is extended or adjusted under 35 U.S.C. 154(b) by 721 days.

(21) Appl. No.: 11/700,268

(22) Filed: Jan. 31, 2007

(65) Prior Publication Data
US 2008/0179637 A1 Jul. 31, 2008

(51) Int. Cl.
*H01L 29/15* (2006.01)

(52) U.S. Cl. ............... 257/77; 257/192; 257/213; 257/201; 257/E21.054; 257/E21.056; 257/E21.057

(58) Field of Classification Search ............... 257/288, 257/E21.054, E21.056, E21.057
See application file for complete search history.

(56) References Cited

U.S. PATENT DOCUMENTS

| | | | |
|---|---|---|---|
| 4,757,028 A | | 7/1988 | Kondoh et al. |
| 4,762,806 A | | 8/1988 | Suzuki et al. |
| 5,091,759 A | * | 2/1992 | Shih et al. ............... 257/192 |
| 5,270,554 A | | 12/1993 | Palmour |
| 5,869,856 A | * | 2/1999 | Kasahara ............... 257/287 |
| 5,925,895 A | | 7/1999 | Sriram et al. |
| 6,218,680 B1 | | 4/2001 | Carter, Jr. et al. |
| 6,537,865 B2 | * | 3/2003 | Inokuchi et al. ............... 438/172 |
| 6,653,740 B2 | * | 11/2003 | Kinzer et al. ............... 257/778 |
| 6,686,616 B1 | | 2/2004 | Allen |
| 6,956,239 B2 | | 10/2005 | Sririam |
| 2004/0099888 A1 | * | 5/2004 | Sriram ............... 257/288 |
| 2007/0292999 A1 | * | 12/2007 | Henning et al. ............... 438/167 |

OTHER PUBLICATIONS

Yokogawa et al., *Electronic Properties of Nitrogen Delta-Doped Silicon Carbide Layers*, Mat. Res. Soc. Symp. Proc., vol. 640, 2001, pp. H2.5.1-H2.5.6.
Ogata et al. "RF characteristics of a fully ion-implanted MESFET on a bulk semi-insulating 4H-SiC substrate" Materials Science Forum vols. 527-529, 2006, pp. 1235-1238.
Konstantinov et al., *Investigation of Lo-Hi-Lo and Delta-Doped Silicon Carbide Structures*, Mat. Res. Soc. Symp. Proc., vol. 640, 2001, pp. H2.4.1-H2.4.6.

* cited by examiner

*Primary Examiner*—Marcos D. Pizarro
*Assistant Examiner*—Eva Yan Montalvo
(74) *Attorney, Agent, or Firm*—Myers Bigel Sibley & Sajovec

(57) ABSTRACT

A unit cell of a metal-semiconductor field-effect transistor (MESFET) includes a semi-insulating substrate having a surface, an implanted n-type channel region in the substrate, and implanted source and drain regions extending from the surface of the substrate into the implanted channel region. A gate contact is between the source and the drain regions, and an implanted p-type region is beneath the source region. The implanted p-type region has an end that extends towards the drain region, is spaced apart vertically from the implanted channel layer, and is electrically coupled to the source region. Methods of forming transistors including implanted channels and implanted p-type regions beneath the source region are also disclosed.

42 Claims, 5 Drawing Sheets

TRANSISTORS HAVING IMPLANTED CHANNELS AND IMPLANTED P-TYPE REGIONS BENEATH THE SOURCE REGION

STATEMENT OF GOVERNMENT INTEREST

The present invention was made, at least in part, with support from the Department of the Navy, contract number N00014-02-C-0250. The Government may have certain rights in this invention.

FIELD OF THE INVENTION

The present invention relates to microelectronic devices and more particularly to transistors, for example, metal-semiconductor field-effect transistors (MESFETs) and related materials.

BACKGROUND

Electrical circuits requiring high power handling capability while operating at high frequencies such as radio frequencies, S-band and X-band have in recent years become more prevalent. Because of the increase in high power, high frequency circuits there has been a corresponding increase in demand for transistors that are capable of reliably operating at radio frequencies and above while still being capable of handling higher power loads. Previously, bipolar transistors and power metal-oxide semiconductor field effect transistors (MOSFETs) have been used for high power applications but the power handling capability of such devices may be limited at higher operating frequencies. Junction field-effect transistors (JFETs) were commonly used for high frequency applications but the power handling capability of previously known JFETs may also be limited.

Metal-semiconductor field effect transistors (MESFETs) have been developed for high frequency applications. The MESFET construction may be preferable for high frequency applications because only majority carriers carry current. The MESFET design may be preferred over MOSFET designs because the reduced gate capacitance permits faster switching times of the gate input. Therefore, although all field-effect transistors utilize only majority carriers to carry current, the Schottky gate structure of the MESFET may make the MESFET more desirable for high frequency applications.

A conventional MESFET structure is illustrated in FIG. 1. The MESFET includes a first epitaxial layer 12 of p-type conductivity on a single crystal bulk silicon carbide substrate 10 of either p-type or n-type conductivity. A second epitaxial layer 14 of n-type conductivity is grown on the first epitaxial layer 12. Wells 16 and 18, of n+ conductivity are formed in the second epitaxial layer 14. A conducting plane 32 may be formed on the opposite side of the substrate from the first epitaxial layer 12.

Ohmic contacts 20 and 22, are formed on wells 16 and 18 to create a source contact 20 and a drain contact 22. A Schottky gate contact 24 is formed on the second epitaxial layer 14 between the source contact 20 and the drain contact 22, and metal overlayers 26, 28 and 30 are formed on the source and drain contacts 20 and 22 and the Schottky gate contact 24. The conductivity of the channel region of the second epitaxial layer 14 between the source well 18 and the drain well 16 is controlled by a bias voltage applied to the gate contact 24. For example, when a sufficiently large negative voltage is applied to the gate contact 24, a depletion region beneath the gate contact extends to the p-type first epitaxial layer 12, pinching off the channel in the second epitaxial layer 14.

In addition to the type of structure, and perhaps more fundamentally, the characteristics of the semiconductor material from which a transistor is formed also affects the operating parameters. Of the characteristics that affect a transistor's operating parameters, the electron mobility, saturated electron drift velocity, electric breakdown field and thermal conductivity may have the greatest effect on a transistor's high frequency and high power characteristics.

Electron mobility is the measurement of how rapidly an electron is accelerated to its saturated velocity in the presence of an electric field. Semiconductor materials which have a high electron mobility are typically preferred because more current can be developed with a lower field, resulting in faster response times when a field is applied. Saturated electron drift velocity is the maximum velocity that an electron can obtain in the semiconductor material. Materials with higher saturated electron drift velocities may be preferred for high frequency applications because the higher velocity translates to shorter times from source to drain.

Electric breakdown field is the field strength at which breakdown of the Schottky junction and the current through the gate of the device suddenly increases. A high electric breakdown field material may be preferred for high power, high frequency transistors because larger electric fields generally can be supported by a given dimension of material. Larger electric fields allow for faster transients as the electrons can be accelerated more quickly by larger electric fields than by smaller fields.

Thermal conductivity is the ability of the semiconductor material to dissipate heat. In typical operations, all transistors generate heat. In turn, high power and high frequency transistors usually generate larger amounts of heat than small signal transistors. As the temperature of the semiconductor material increases, the junction leakage currents generally increase and the current through the field effect transistor generally decreases due to a decrease in carrier mobility with an increase in temperature. Therefore, if the heat is dissipated from the semiconductor, the material will remain at a lower temperature and be capable of carrying larger currents with lower leakage currents.

High frequency MESFETs may be manufactured of n-type III-V compounds, such as gallium arsenide (GaAs) because of their high electron mobilities. Although these devices provide increased operating frequencies and moderately increased power handling capability, the relatively low breakdown voltage and the lower thermal conductivity of these materials have limited their usefulness in high power applications.

Silicon carbide (SiC) has been known for many years to have excellent physical and electronic properties which should theoretically allow production of electronic devices that can operate at higher temperatures, higher power and higher frequency than devices produced from silicon (Si) or GaAs. The high electric breakdown field of about $4 \times 10^6$ V/cm, high saturated electron drift velocity of about $2.0 \times 10^7$ cm/sec and high thermal conductivity of about 4.9 W/cm-°K indicate that SiC would be suitable for high frequency, high power applications.

MESFETs having channel layers of silicon carbide have been produced on silicon substrates (See, e.g., U.S. Pat. Nos. 4,762,806 to Suzuki et al. and 4,757,028 to Kondoh et al.). Because the semiconductor layers of a MESFET are epitaxial, the layer upon which each epitaxial layer is grown affects the characteristics of the device. Thus, a SiC epitaxial layer grown on a Si substrate generally has different electrical and thermal characteristics then a SiC epitaxial layer grown on a different substrate. Although the SiC on Si substrate devices described in U.S. Pat. Nos. 4,762,806 and 4,757,028 may have exhibited improved thermal characteristics, the use of a Si substrate generally limits the ability of such devices to dissipate heat. Furthermore, the growth of SiC on Si generally results in defects in the epitaxial layers that result in high leakage current when the device is in operation.

In general, MESFETs on SiC substrates have exhibited improved thermal characteristics over previous devices because of the improved crystal quality of the epitaxial layers grown on SiC substrates. However, to obtain high power and high frequency it may be necessary to overcome the limitations of SiC's lower electron mobility.

Similarly, commonly assigned U.S. Pat. No. 5,270,554 to Palmour describes a SiC MESFET having source and drain contacts formed on n+ regions of SiC and an optional lightly doped epitaxial layer between the substrate and the n-type layer in which the channel is formed. U.S. Pat. No. 5,925,895 to Sriram et al. also describes a SiC MESFET and a structure that is described as overcoming "surface effects" which may reduce the performance of the MESFET for high frequency operation. Sriram et al. also describes SiC MESFETs that use n+ source and drain contact regions as well as a p-type buffer layer. SiC MESFETs are also discussed in U.S. Pat. No. 6,686,616 to Lipkin et al.

Furthermore, conventional SiC FET structures may provide constant characteristics during the entire operating range of the FET, i.e. from fully open channel to near pinch-off voltage, by using a very thin, highly doped channel (a delta doped channel) offset from the gate by a lightly doped region of similar conductivity type. Delta doped channels are discussed in detail in an article by Yokogawa et al. entitled Electronic Properties of Nitrogen Delta-Doped Silicon Carbide Layers, MRS Fall Symposium, 2000 and an article by Konstantinov et al. entitled Investigation of Lo-Hi-Lo and Delta Doped Silicon Carbide Structure, MRS Fall Symposium, 2000. However, further improvements may be made in SiC MESFETs.

For example, it may be important that SiC MESFETs have high breakdown voltages and relatively low leakage currents if they are used in high efficiency, high power, high linearity radio frequency (RF) applications. In an attempt to provide high breakdown voltages, devices have been provided having highly compensated substrates, such as vanadium doped semi-insulating SiC. These devices typically provide adequate breakdown voltages as well as low leakage currents, but may sacrifice device performance due to unwanted trapping effects in the substrate. Furthermore, devices having highly doped p-type layers under the channel of the FET have been provided and have been successful in providing good electron confinement and low leakage currents. However, these devices generally contain excessive parasitics that may degrade the RF performance of the device. Accordingly, further improvements may be made with respect to existing SiC FET devices such that they may provide improved breakdown voltages without sacrificing other performance characteristics of the device.

SUMMARY

A unit cell of a metal-semiconductor field-effect transistor (MESFET) according to some embodiments of the invention includes a semi-insulating substrate having a surface, an n-type channel region beneath the surface of the substrate, and source and drain regions extending from the surface of the substrate into the channel region. A gate contact is between the source and the drain regions, and an p-type region is beneath the source region. The p-type region has an end that extends towards the drain region, is spaced apart vertically from the channel layer, and is electrically coupled to the source region.

The p-type region may include aluminum and/or boron having a dopant concentration of from about $1\times10^{18}$ cm$^{-3}$ to about $1\times10^{20}$ cm$^{-3}$. The p-type region may have a peak concentration at a depth of from about 0 μm to 0.5 μm beneath the surface of the substrate. The p-type region may be spaced apart vertically from the channel region by a distance of about 0.1 μm to about 0.5 μm. The MESFET may further include an p-type well region extending from the surface of the substrate to the p-type region.

The gate may have a first sidewall and a second sidewall, the first sidewall being on the source side of the gate and the second sidewall being on the drain side of the gate. The p-type region may extend from beneath the source to the first sidewall of the gate without extending past the first sidewall of the gate. The p-type region may extend from beneath the source to within about 0.1 to about 0.3 μm of the first sidewall on the source side of the first sidewall. In some embodiments, the p-type region may extend from beneath the source to the second sidewall of the gate without extending past the second sidewall of the gate. In some embodiments, the p-type region may extend from beneath the source to between the first and second sidewalls of the gate.

In some embodiments, the p-type region may extend from beneath a source contact and/or the source region without extending to beneath a drain contact and/or the drain implant region.

The substrate may include a silicon carbide (SiC) substrate, the p-type region being in the SiC substrate. The substrate may include an HPSI SiC substrate.

The channel region may include a first n-type conductivity channel layer having a first dopant concentration and a second n-type conductivity channel layer on the first n-type conductivity channel layer and having a second dopant concentration. The first n-type conductivity channel layer may be between the second n-type conductivity channel layer and the p-type region, and the first dopant concentration may be greater than the second dopant concentration.

The first n-type conductivity channel layer may have a dopant concentration of about $3\times10^{18}$ cm$^{-3}$ and the second n-type conductivity channel layer may have a dopant concentration of about $1\times10^{16}$ cm$^{-3}$. The first n-type conductivity channel layer may have a thickness of about 0.28 μm, and the second n-type conductivity channel layer may have a thickness of about 900 Å.

The n-type conductivity channel region may include a first n-type conductivity channel layer having a first dopant concentration, a second n-type conductivity channel layer having a second dopant concentration, and a third n-type conductivity channel layer having a third dopant concentration and being disposed between the first and second n-type conductivity channel layers. The third dopant concentration may be less than the first and second dopant concentrations.

The substrate may include at least one of n-type conductivity gallium arsenide (GaAs) and n-type conductivity gallium nitride (GaN), the n-type conductivity channel layer may include at least one of n-type conductivity GaAs and n-type conductivity GaN, and the p-type region may include at least one of p-type conductivity GaAs and p-type conductivity GaN.

The MESFET may further include source and drain ohmic contacts on the source and drain regions, respectively, and a recess between the source and drain regions that extends into the channel layer. The gate may be disposed in the recess and may extend into the channel layer.

The MESFET may further include a p-type well region extending from the surface of the substrate to the p-type region, an ohmic contact on the p-type well region, and a first overlayer on the drain ohmic contact and a second overlayer on the source ohmic contact and the ohmic contact on the p-type well region, respectively. The second overlayer electrically couples the source ohmic contact and the ohmic contact on the p-type well region. The source and drain contacts include nickel contacts.

The source and drain regions may have dopant concentrations greater than a dopant concentration of the channel layer. In particular, the source and drain regions may have dopant concentrations of about $1\times10^{19}$ cm$^{-3}$.

The MESFET may further include first and second ohmic contacts on the source and drain regions, respectively, a first recess between the source region and the drain region that exposes the n-type channel layer, the first recess having first and second sidewalls, and a second recess disposed between the first and second sidewalls of the first recess and extending into the n-type conductivity channel layer. The gate contact may be in the second recess. A p-type well region extends from the surface of the substrate to the p-type region, and a third ohmic contact is on the p-type well region.

The n-type conductivity channel region may include first and second conductivity layers, the first recess may extend through the first n-type conductivity channel layer to the second n-type conductivity channel layer and may expose the second n-type conductivity channel layer. The second recess may extend into the second n-type conductivity layer. In particular, the second recess may extend about 600 Å into the second n-type conductivity region. The gate may have a length from about 0.4 μm to about 0.7 μm. The distance from the source to the gate may be from about 0.5 μm to about 0.7 μm, and/or the distance from the drain to the gate may be from about 1.5 μm to about 2 μm.

Some embodiments of the invention provide a MESFET including a plurality of unit cells as described above, in which a distance from a first gate to a second gate may be from about 20 μm to about 150 μm.

Methods of forming a metal-semiconductor field-effect transistor according to some embodiments of the invention include forming spaced apart source and drain regions in a semi-insulating substrate, implanting first impurity atoms to form an implanted n-type channel region at a surface of the semi-insulating substrate, the spaced apart source and drain regions extend into the channel region, implanting second impurity atoms to form an implanted p-type region beneath the n-type channel region, annealing the implanted first and second impurity atoms, and forming a gate contact on the semi-insulating substrate between the source and drain regions. In some embodiments, the first and second impurity atoms may be annealed separately.

Implanting the first impurity atoms may be performed at a temperature above room temperature. For example, implanting the first impurity atoms may be performed at a temperature of at least about 1100° C. In further embodiments, annealing the implanted first and second impurity atoms may be performed at a temperature of at least about 1400° C. Further, annealing the implanted first and second impurity atoms may be performed at a temperature of from about 1400° C. to about 1700° C. In particular embodiments, annealing the implanted first and second impurity atoms may be performed at a temperature of about 1600° C. Annealing the implanted first and second impurity atoms may be performed for about 5 minutes to about 30 minutes.

The methods may further include forming a recess in the semi-insulating substrate, and forming the gate contact may include forming the gate contact in the recess.

The implanted p-type region may be spaced apart vertically from the channel region by a distance of from about 0.1 to 0.5 μm.

Forming the channel region may include forming a first channel region having a first dopant concentration and a second channel region on the first channel region and having a second dopant concentration that may be different from the first dopant concentration. The first dopant concentration may be about $3\times10^{17}$ cm$^{-3}$ and the second dopant concentration may be about $1\times10^{16}$ cm$^{-3}$.

The methods may further include forming a first recess extending through the second channel region to the first channel region so that the first channel region may be exposed, and forming a second recess extending into the first channel region. The channel region may further include a third channel region having a third dopant concentration. Forming the gate contact may include forming the gate contact in the second recess.

The semi-insulating substrate may include a semi-insulating silicon carbide substrate. The first impurity atoms include nitrogen or phosphorus and the second impurity atoms include boron and/or aluminum.

The methods may further include implanting third impurity atoms to form a p-type well region extending from a surface of the substrate to the implanted p-type region. The third impurity atoms include boron and/or aluminum. The methods may further include forming an ohmic contact to the p-type well region, forming an ohmic contact to the source region, and forming a metal overlayer contacting the ohmic contact to the p-type well region and the ohmic contact to the source region to thereby electrically connect the p-type well region to the source region.

The gate contact may have a first sidewall and a second sidewall, the first sidewall being on the source side of the gate and the second sidewall being on the drain side of the gate. Forming the p-type region may include forming the p-type region to extend from beneath the source to the first sidewall of the gate without extending past the first sidewall of the gate.

The gate contact may have a first sidewall and a second sidewall, the first sidewall being on the source side of the gate and the second sidewall being on the drain side of the gate, and forming the p-type region may include forming the p-type region extending from beneath the source to within about 0.1 to about 0.3 μm of the first sidewall of the gate on the source side of the first sidewall. In some embodiments, forming the p-type region may include forming the p-type region extending from beneath the source to the second sidewall of the gate without extending past the second sidewall of the gate. In some embodiments, forming the p-type region may include forming the p-type region extending from beneath the source to between the first and second sidewalls of the gate.

In further embodiments, forming the p-type region may include forming the p-type region extending from beneath a source contact and/or a source implant region without extending to beneath a drain contact. In still further embodiments, forming the p-type region may include forming the p-type region extending from beneath a source contact and/or a source implant region without extending to beneath a drain implant region.

The methods may further include forming a first recess between the source and the drain that extends into the n-type conductivity channel layer, the gate being formed in the first recess and extending into the n-type conductivity channel layer, forming an oxide layer on the n-type conductivity channel layer and in the first recess, and forming first and second ohmic contacts on the n-type channel layer that respectively define the source and the drain. A p-type well region is formed that extends from a surface of the substrate to the p-type region, and a third ohmic contact is formed on the p-type well region.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
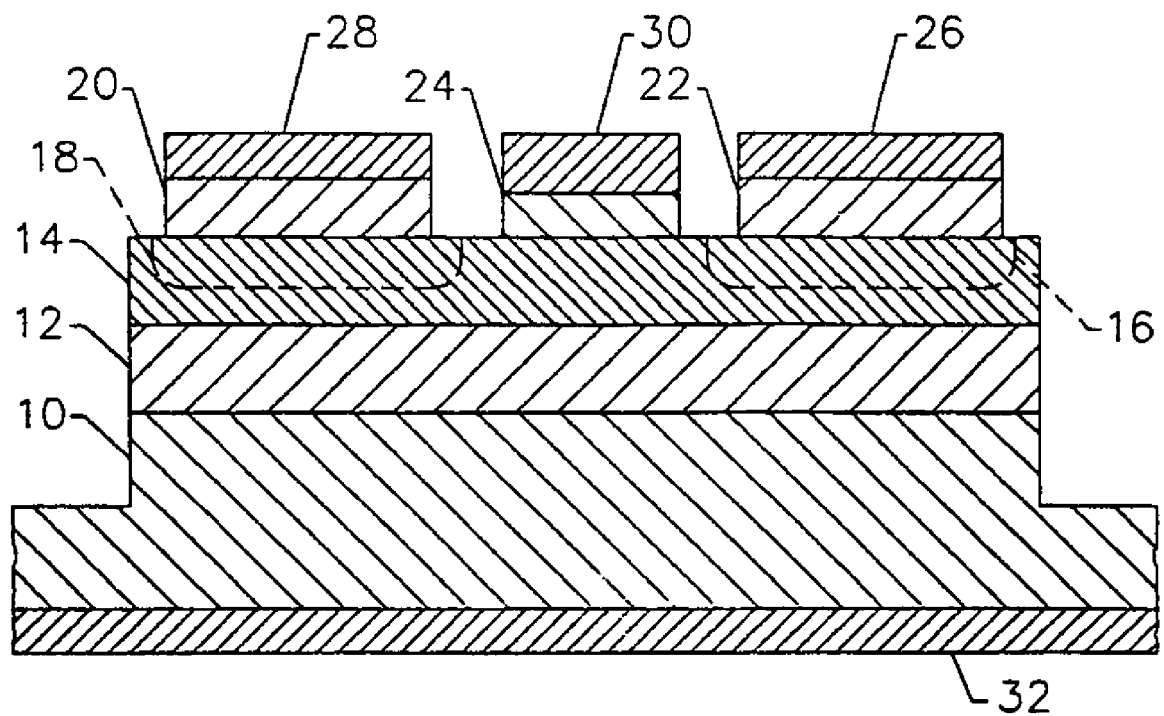
FIG. 1 is a cross-sectional view of a conventional transistor.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" or "upper" or "top" or "lateral" or "vertical" may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein the term "ohmic contact" refers to contacts where an impedance associated therewith is substantially given by the relationship of Impedance V/I, where V is a voltage across the contact and I is the current, at substantially all expected operating frequencies (i.e., the impedance associated with the ohmic contact is substantially the same at all operating frequencies) and currents.

Embodiments of the present invention will now be described in detail below with reference to figures that illustrate various embodiments of the present invention and various processes of fabricating embodiments of the present invention. Transistors, for example, a metal-semiconductor field effect transistors (MESFETs) according to some embodiments of the present invention, may be provided having p-type conductivity regions beneath the source regions of the MESFET having ends that extend toward the drain regions of the MESFET. MESFETs having p-type conductivity regions beneath the source regions are discussed in commonly assigned U.S. Pat. No. 6,956,239, entitled "Transistors Having Buried P-Type Layers Beneath The Source Region And Methods Of Fabricating The Same," the disclosure of which is hereby incorporated herein by reference as if set forth in its entirety. As described therein, the presence of the buried p-type conductivity region may provide, for example, devices having improved breakdown voltages without compromising other performance characteristics of the device.

However, formation of a conventional MESFET including a buried p-type region may involve a number of semiconductor processing steps, including multiple implantation steps as well as epitaxial growth/regrowth steps. In particular, epitaxial growth steps involved in the fabrication of a transistor may have a number of drawbacks. For example, in order to grow lattice-matched epitaxial layers of the correct polytype on silicon carbide, a silicon carbide boule is typically cut at an angle to form an off-axis wafer. The off-axis angle of the resulting wafer-enables step-flow-growth of epitaxial layers therefrom and provides polytype information to the growing epitaxial layer. However, slicing a boule off-axis results in the yield of fewer wafers per boule, since the boule is cut diagonally. Doping uniformity may also be a problem for off-axis wafers, since portions of the same wafer are formed at different times under different growth conditions. These problems may be especially significant in the manufacture of high purity semi-insulating wafers as described, for example, in U.S. Pat. No. 6,218,680. Furthermore, the problem is exacerbated as wafer diameters increase.

A further problem associated with epitaxial growth is that the epitaxial layers may obscure alignment marks that are used to align the implanted regions of the device. For example, the buried p+ region may be formed before epitaxial growth of the channel layer. The geometry of the channel layer may be defined with reference to alignment marks associated with the p+ region, which may be blurred or otherwise obscured by the epitaxial layer itself. Accordingly, misalignment may occur between the buried p+ region and the source and drain regions of the device.

Figure 2:
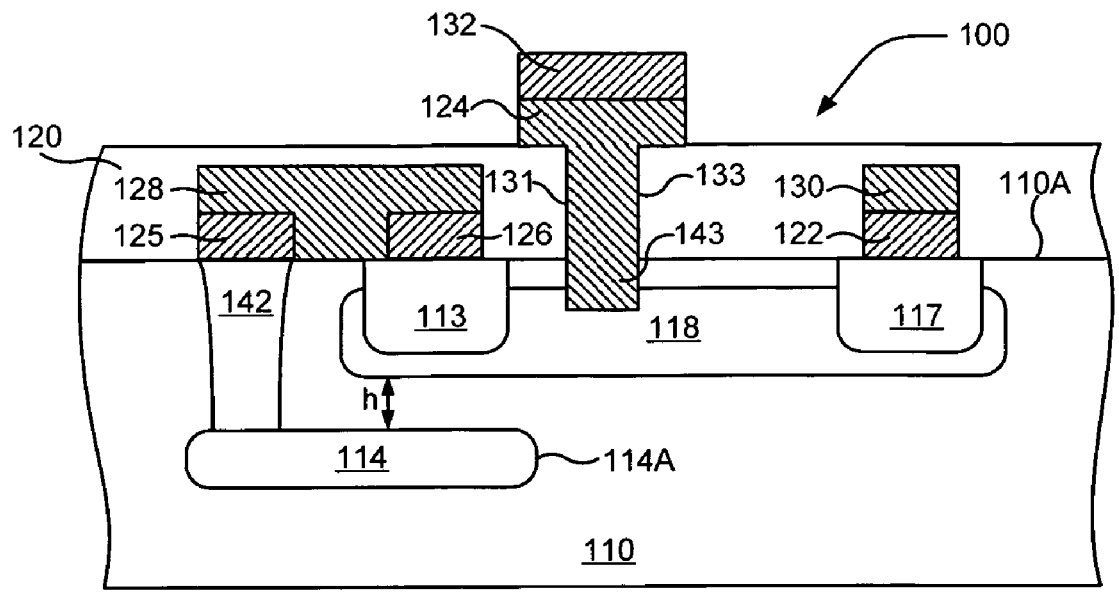
FIGS. 2-5 are cross-sectional views of transistors according to embodiments of the invention.

A transistor structure 100 according to some embodiments of the invention is shown in FIG. 2. As seen in FIG. 2, a substrate 110 is provided. The substrate 110 may be a semi-insulating single crystal bulk silicon carbide (SiC) substrate. In particular, the substrate 110 may be a high purity semi-insulating (HPSI) SiC substrate formed as described, for example, in the aforementioned U.S. Pat. No. 6,218,680. HPSI substrates are available from Cree, Inc., Durham, N.C.

A source implant region 113, a drain implant region 117 and an implanted channel region 118 are provided in the substrate 110. The source implant region 113 and the drain implant region 117 extend from an upper surface 110A of the substrate 110 into the implanted channel region 118. Source and drain contacts 126, 122 are provided on the source implant region 113 and the drain implant region 117, respectively. A gate contact 124 also extends into the implanted channel region 118 in a first recess 143 between the source implant region 113 and the drain implant region 117. The first recess 143 may extend to/into the channel layer 118. The first recess 143 may be formed, for example, by partially etching the substrate 110 into the channel layer 118. The first recess 143 may be formed by an etching process, such as a dry or wet etch process. For example, the first recess 143 may be formed by a dry etching process, such as Electron Cyclotron Resonance (ECR) or Inductively Coupled Plasma (ICP) etching. Techniques for etching silicon carbide are well known in the art. Since the conductivity and/or the location of the implanted channel layer 118 may be accurately controlled by utilizing embodiments of the present invention, etching the first recess 143 may be more easily performed. For example, a timed etch may be performed to form the first recess 143, which may avoid the need for repeatedly etching the recess and testing the sheet resistance of the channel region after each iteration to determine if the etch process should be repeated.

Figure 2A:
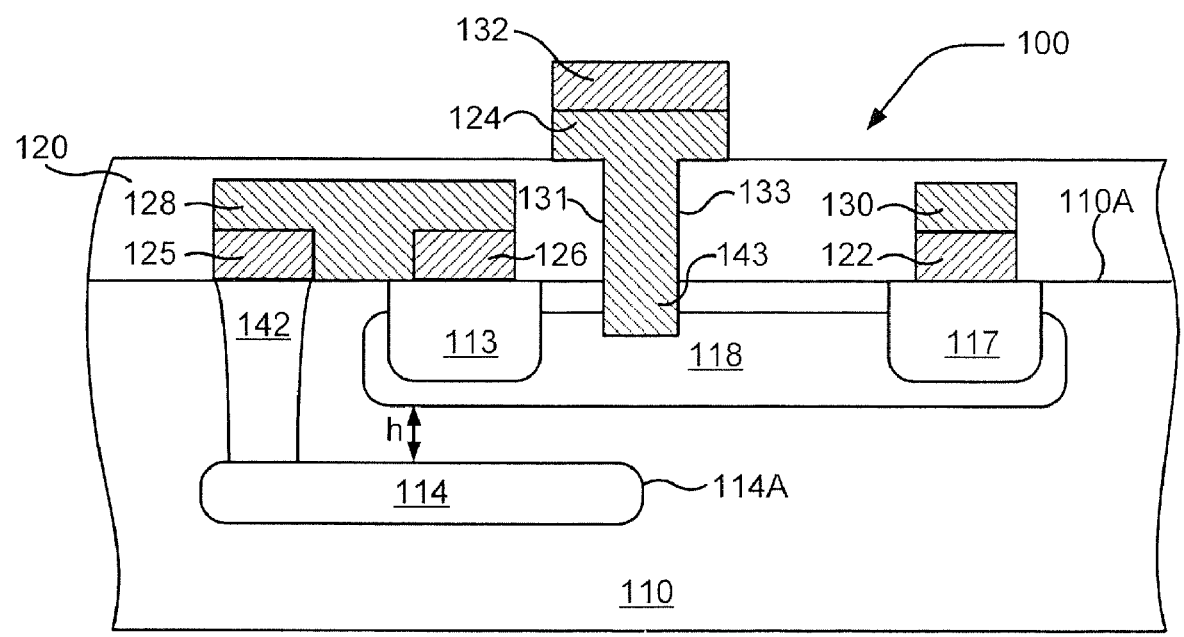

A buried p+ region 114 is provided beneath the source implant region 113 of the device 100. The p+ region 114 has an end 114A that extends towards the drain implant region 117 of the device 110. In some embodiments of the present invention, the p+ region 114 may extend from beneath the source contact 126 and/or from beneath an n+ source implant region 113 without extending to beneath an n+ drain implant region 117. In further embodiments of the present invention, the p+ region 114 may extend from beneath the source contact 126 and/or from beneath the n+ source implant region 113 without extending to beneath a drain contact 122. In still further embodiments, the p+ region 114 may further extend from beneath the source contact 126 and/or from beneath the n+ source implant region 113 to the first sidewall 131 of the gate 124 without extending past the first sidewall 131 of the gate 124, from beneath the source contact 126 and/or from beneath the n+ source implant region 113 to the second sidewall 133 of the gate 124 without extending past the second sidewall 133 of the gate 124, or from beneath the source contact 126 and/or from beneath the n+ source implant region 113 to a point between the first sidewall 131 and the second sidewall 133 of the gate 124 as illustrated in FIG. 2A. In certain embodiments of the present invention, the p+ region 114 may extend to a point within about 0.1 to about 0.3 μm of the first sidewall 131 of the gate 124 on the source side.

For the p+ region 114, dopant concentrations of from about $1\times10^{18}$ cm$^{-3}$ to about $1\times10^{20}$ cm$^{-3}$ may be suitable, but dopant concentrations as high as possible may be used. The dopant concentration may not be constant throughout the p+ region 114. The presence of the p+ region 114 beneath the source region 113 may inhibit electron injection from the source, thus, possibly providing an improved breakdown voltage. Furthermore, the fact that the p+ region 114 does not extend to beneath the drain region may reduce the introduction of parasitics into the device and, thus, device performance may not be influenced. The p+ region 114 may be formed to have a peak dopant concentration located at a depth of from about 0.3 μm to about 0.8 μm beneath the surface 110A of the substrate 110. In particular, the p+ region 114 may have a peak concentration located at a depth of about 0.7 μm from the surface 110A of the substrate 110. The p+ region 114 may have a thickness of about 0.5 μm. The p+ region 114 may be spaced apart vertically from the implanted channel region 118 by a distance h of from about 0.1 μm to about 0.5 μm. In particular, the p+ region 114 may be spaced apart vertically from the implanted channel region 118 by about 0.5 μm. Furthermore, the implanted n-type channel layer 118 may be formed to have a peak concentration located about 0.2 μm from the surface 110A of the substrate 110.

Still referring to FIG. 2, n+ source and drain implant regions 113 and 117 are provided in the source and drain regions of the device, respectively. Regions 113 and 117 are typically of n-type conductivity silicon carbide and have dopant concentrations that are greater than the dopant concentration of the implanted n-type conductivity channel layer 18. For the n+ regions 113 and 117, dopant concentrations of about $1\times10^{19}$ cm$^{-3}$ may be suitable, but dopant concentrations as high as possible may be used. Source and drain implant regions 113, 117 may be formed, for example, using selectively implanted phosphorus atoms.

Ohmic contacts 126 and 122 are provided on the implanted regions 113 and 117, respectively, and are spaced apart so as to provide the source contact 126 and the drain contact 122. An ohmic contact 125 is provided on a p+ well region 142 that extends from a surface 10A of the substrate 110 to the buried p+ region 114. The ohmic contacts 125, 126 and 122 may be formed of nickel or other suitable metals. The p+ region 114 may be maintained at the same potential as the source by, for example, electrically coupling the p+ ohmic contact 125 to the source contact 126 using a metal overlayer 128. An insulator layer 120, such as an oxide, may be further provided on the exposed surface of the device.

The gate contact 124 may be provided in the first recess 143 between the source implant region 113 and the drain implant region 117. The gate contact 124 may be formed of chromium, platinum, platinum silicide, nickel, and/or TiWN, however, other metals such as gold, known to one skilled in the art to achieve the Schottky effect, may be used. The Schottky gate contact 124 typically has a three layer structure. For example, the gate contact 124 can optionally include a first gate layer of chromium (Cr) contacting the n-type conductivity channel layer 118. Such a structure may have advantages because of the high adhesion of chromium (Cr). The gate contact 124 may further include an overlayer 132 of platinum (Pt) and gold or other highly conductive metal. Alternatively, the gate contact 124 may include a first layer of nickel in the first recess 143 on the n-type conductivity channel layer 118.

As further illustrated in FIG. 2, metal overlayers 128, 130 may be provided on the source and well region contacts 126 and 125, and the drain contact 122, respectively. The overlayers 128, 130 may be gold, silver, aluminum, platinum and/or copper. Other suitable highly conductive metals may also be used for the overlayer. Furthermore, the metal overlayer 128 may electrically couple the well region contact 125 to the source contact 126.

In selecting the dimensions of the MESFET, the width of the gate is defined as the dimension of the gate perpendicular to the flow of current. As shown in the cross-section of FIG. 2, the gate width runs into and out of the page. The length of the gate is the dimension of the gate parallel to the flow of current. As seen in the cross-sectional views of FIG. 2, the gate length is the dimension of the gate 124 that is in contact with the n-type conductivity channel layer 118. For example, the gate length of the MESFET according to certain embodiments of the present invention may be from about 0.4 µm to about 0.7 µm. Another important dimension is the source to gate distance, which is shown in the cross-section of FIG. 2, as the distance from the source contact 126 or the n+ region 113, to the gate contact 124. The source to gate distance according to certain embodiments of the present invention may be from about 0.5 µm to about 0.7 µm. Furthermore, the distance from the drain 122 to the gate 124 may be from about 1.5 µm to about 2 µm. Embodiments of the present invention may further include a plurality of unit cells of MESFETs, and the distance from a first gate of the unit cells to a second gate may be, for example, from about 20 µm to about 50 µm.

The p+ region 114 may be formed by implantation of boron and/or aluminum atoms. In particular, it may be possible to implant boron and/or aluminum into a SiC substrate at a suitable depth to form the p+ region 114 beneath the source implant region 113. It will be appreciated that it may be difficult to implant aluminum at depths sufficient to create the p+ region 114 without having to perform epitaxial regrowth in order to provide adequate separation between the p+ region 114 and the source implant region 113. However, some embodiments provide implant conditions for aluminum that permit implantation of aluminum at depths sufficient to create the p+ region 114.

In some embodiments of the invention, the p+ region 114 may be formed by implanting boron atoms into a silicon carbide substrate at an energy of 380 keV and a dose of about $1\times10^{14}$ to about $1\times10^{15}$ atoms/cm$^2$. In some embodiments of the invention, the p+ region 114 may be formed by implanting boron atoms into a silicon carbide substrate at an energy of 380 keV and a dose of about $2\times10^{14}$ atoms/cm$^2$. In some embodiments of the invention, the p+ region 114 may be formed by implanting aluminum atoms into a silicon carbide substrate at an energy of 380 keV and a dose of about $2\times10^{14}$ atoms/cm$^2$.

Figure 6A:
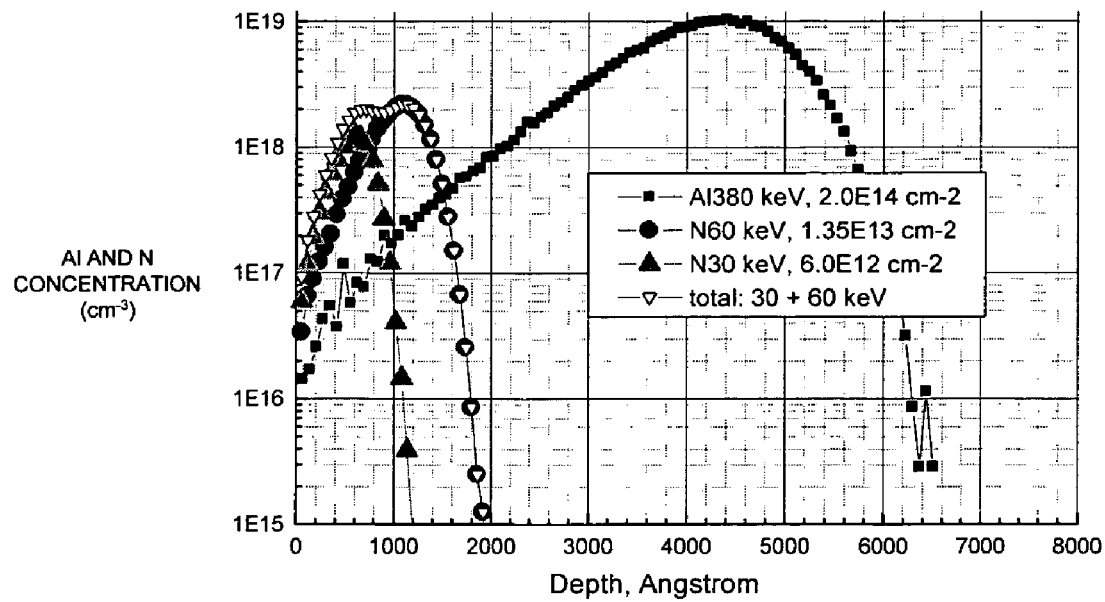
FIG. 6A is a simulated profile for aluminum and nitrogen implants according to some embodiments of the invention.

FIG. 6A is a simulated profile for aluminum and nitrogen implants according to some embodiments of the invention. In the embodiments shown in FIG. 6A, a channel implant was simulated using two nitrogen implants including a first implant at a dose of $1.35\times10^{13}$ atoms/cm$^2$ and an implant energy of 60 keV and a second implant at a dose of $6.0\times10^{12}$ atoms/cm$^2$ and an implant energy of 30 keV. A buried p+ layer was simulated beneath the channel implant by implanting aluminum ions at a dose of $2.0\times10^{14}$ atoms/cm$^2$ and an implant energy of 380 keV. The resulting aluminum profile has a peak concentration of about $1\times10^{19}$ cm$^{-3}$ at a depth of about 0.44 µm.

Figure 6B:
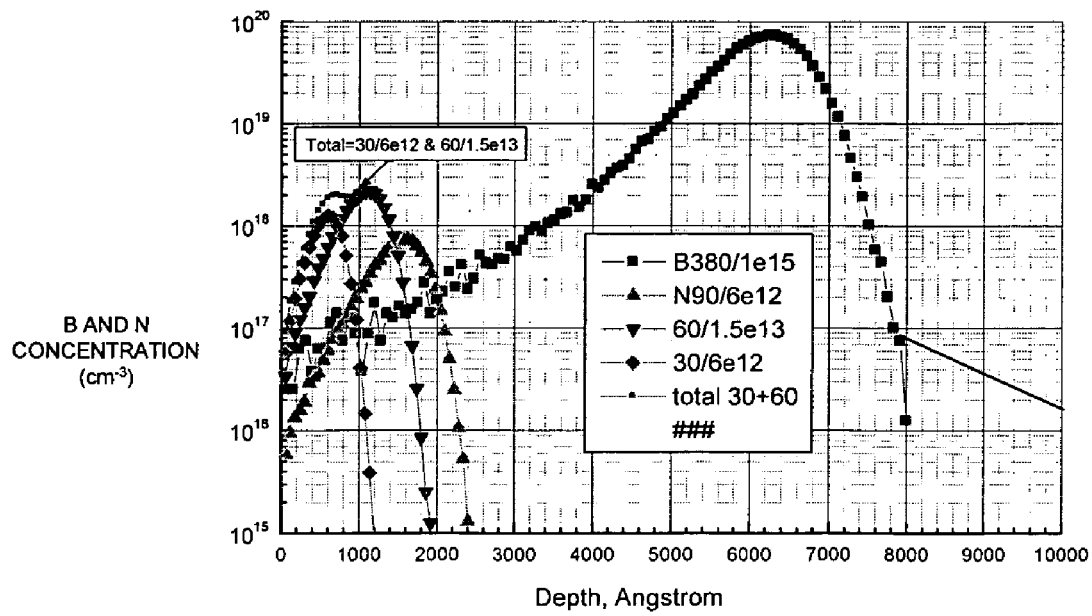
FIG. 6B is a simulated profile for boron and nitrogen implants according to some embodiments of the invention.

FIG. 6B is a simulated profile for boron and nitrogen implants according to some embodiments of the invention. In the embodiments shown in FIG. 6B, a channel implant was simulated using two nitrogen implants including a first implant at a dose of $1.5\times10^{13}$ atoms/cm$^2$ and an implant energy of 60 keV and a second implant at a dose of $6.0\times10^{12}$ atoms/cm$^2$ and an implant energy of 30 keV. A second nitrogen implant was simulated using only a single implant at a dose of $6\times10^{12}$ atoms/cm$^2$ and an implant energy of 90 keV. A buried p+ layer was simulated beneath the channel implant by implanting boron ions at a dose of $1.0\times10^{15}$ atoms/cm$^2$ and an implant energy of 380 keV. The resulting boron profile has a peak concentration of about $8\times10^{19}$ cm$^{-3}$ at a depth of about 0.62 µm. Thus, at similar implant energies, it is anticipated that boron will have a larger range than aluminum when implanted into SiC.

Referring again to FIG. 2, the p+ well region 142 may also be formed using implanted boron and/or aluminum atoms. For example, the p+ well region 142 may be formed using a series of implants at different implant energies to provide a desired doping profile that extends from the surface 110A of the substrate 110 to the p+ region 114.

An n-type impurity such as nitrogen and/or phosphorus may be implanted into the substrate 110 to form an implanted channel layer 118 therein. The implanted channel layer 118 may have a dopant concentration greater than about $1\times10^{17}$ cm$^{-3}$, and may have a peak dopant concentration in a range of from about $3\times10^{17}$ cm$^{-3}$ to about $2\times10^{18}$ cm$^{-3}$. In particular embodiments, the implanted channel region 118 may have a peak dopant concentration of about $1\times10^{18}$ cm$^{-3}$. The implanted channel region may have a thickness of from about 50 nm to about 300 nm. In particular embodiments, the implanted channel region 118 has a thickness of about 100 nm. The peak concentration of implanted dopant atoms may be located about 60 nm to 200 nm from the surface of the substrate 110. In particular embodiments, the peak concentration of implanted dopant atoms may be located about 150 nm from the surface of the substrate 110.

Conventionally, implanted channel layers have not been used in SiC MESFETs because of the reduced carrier mobility resulting from damage to the semiconductor lattice caused by the implantation process. However, embodiments of the present invention may employ a low-damage implant process to form implanted channel regions 118 having acceptable mobility, sheet resistance and/or other properties.

Since the channel layer 118 of a device according to some embodiments of the invention is implanted, many different dopant profiles can be accurately and repeatably created within the channel layer 18. Accordingly, operational properties of MESFET devices according to some embodiments of the invention may be more accurately controlled and/or engineered compared to conventional MESFET structures in which the channel region is doped during epitaxial growth.

Figure 3:
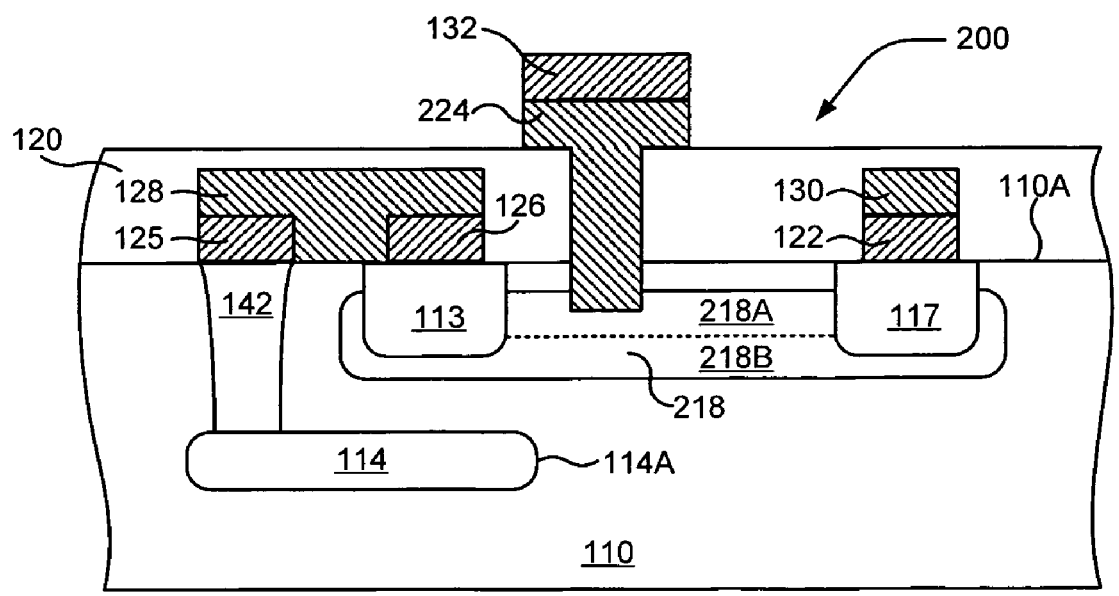

For example, referring to FIG. 3, a device 200 according to some embodiments of the invention may include an n-type conductivity channel layer 218 including a first n-type conductivity sublayer 218A and a second n-type conductivity sublayer 218B. The gate contact 224 may extend into the first n-type conductivity sublayer 218A. The first n-type conductivity sublayer 218A may have a higher dopant concentration than the second n-type conductivity sublayer 218B.

Figure 4:
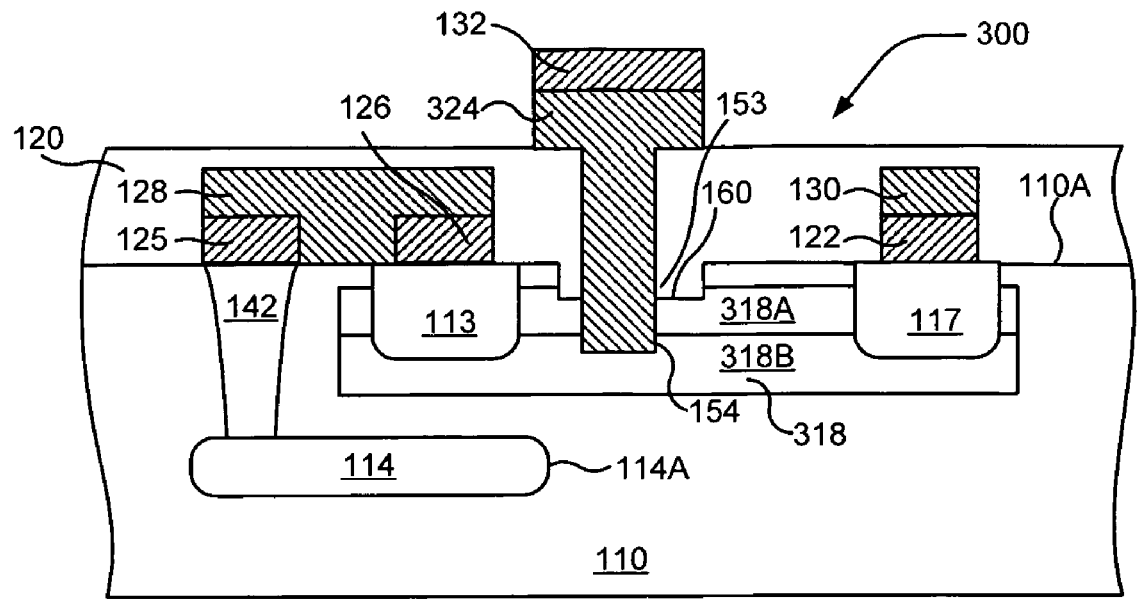

Transistors according to some embodiments of the present invention may include a double recessed structure including first and second recesses as illustrated in FIG. 4. In particular, in a device 300 according to some embodiments of the invention, a first recess 153 has a floor 160 that extends into a first n-type conductivity channel layer 318A. A second recess 154 is provided between the sidewalls of the first recess 153. The second recess 154 extends into the second n-type conductivity channel layer 318B by, for example, a distance of about 600 Å. The gate 324 may be disposed in the second recess 154. A double recessed structure is discussed further in commonly assigned U.S. patent application Ser. No. 10/136,456 to Sriram, the disclosure of which is incorporated herein by reference as if set forth herein.

Figure 5:
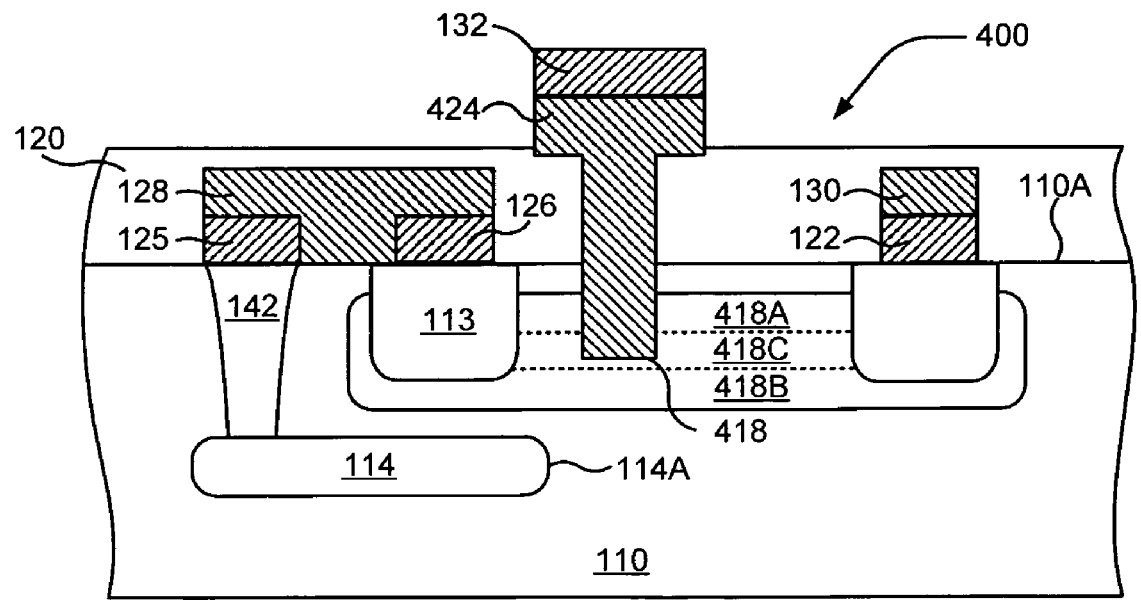

In further embodiments, the n-type conductivity channel layer may include first, second and third layers of n-type conductivity SiC as discussed in detail in commonly assigned U.S. patent application Ser. No. 10/136,456 to Sriram, the disclosure of which is incorporated herein by reference as if set forth in its entirety. For example, as shown in FIG. 5, a device 400 includes an n-type channel region 418 that includes a first sublayer 418A, a second sublayer 418B and a third sublayer 418C disposed between the first and third sublayers 418A, 418B.

Delta doping of channels may be accomplished more accurately and/or reliably according to some embodiments of the invention. For example, the implanted channel layer 418 of the device 400 may have a dual peak configuration. That is, the implanted channel layer 418 may include a pair of dopant concentration peaks formed in multiple implant steps corresponding to the first and second n-type conductivity sublayers 418A, 418B. The first and second n-type conductivity sublayers 418A, 418B may be spaced apart from one another to provide a channel region having first, second and third sublayers 418A, 418B, 418C similar to the structure described in the above-referenced U.S. patent application Ser. No. 10/136, 456. The first sublayer 418A may have a first dopant concentration, the second sublayer 418B may have a second dopant concentration, and the third sublayer 418C disposed between the first and second sublayers 418A, 418B may have a third dopant concentration that is less than the first and second dopant concentrations. In brief, the more highly doped regions (i.e. the first and second sublayers 418A, 418B) near the concentration peaks may act as carrier supply regions for the central sublayer 418C of relatively low dopant concentration between the two dopant peaks. The centrally located third sublayer 418C may have increased mobility compared to the more highly doped first and second sublayers 418A, 418B, which may result in improved device performance. The gate contact 424 may extend to/into the third sublayer 418C.

Ion implantation is a well-known method of doping a semiconductor layer with impurities. Ion implantation is useful for selective doping of crystalline material in order to form desired regions in the material, such as p-n junctions, highly conductive contact regions, field spreading regions, etc. In an ion implantation process, ionized impurity atoms are accelerated through an electric field towards a target layer, where they become embedded. The number of ions per unit area directed at a target layer is referred to as the dose, which is typically expressed in ions/cm$^2$. The ions are accelerated at an energy level, typically expressed in electron-volts (eV). The distribution of ions in the implanted layer depends on the dose and energy of the implant, sometimes referred to as the implant conditions, as well as the type of ions implanted, the type of material the ions are implanted into, the angle of the implants, and other factors. In each implant step, the implanted ions typically form a concentration distribution that has a peak concentration at a particular depth (i.e., the "implant range"). Multiple implant steps may be performed using different implant conditions to build up a desired dopant concentration profile.

Typically, after impurities are implanted into a semiconductor layer, it is desirable to anneal the implanted impurities at a high temperature, i.e. a so-called activation anneal. An activation anneal may repair damage caused by the implantation of high-energy ions into the semiconductor lattice. Implant damage may include, for example, broken and/or rearranged chemical bonds within the semiconductor lattice. The activation anneal may also assist implanted impurity ions in finding a suitable site in the crystal lattice at which the ions may appropriately act as acceptors and/or donors.

Referring again to FIG. 2, in some embodiments of the invention, implantation of ions to form the implanted channel layer 118 may be performed at relatively low implant energies and/or doses, and/or at relatively high temperatures in order to provide an implanted channel layer 118 having acceptable mobility. For example, the implanted channel layer 118 may be formed by implanting ions with an implant energy of 90 keV or less and/or with a dose of $9 \times 10^{12}$ atoms/cm$^2$ or less.

Furthermore, the implants may be performed at an elevated temperature, for example, at a temperature greater than about 350° C. In particular embodiments, the implants may be performed at a temperature of about 1100° C. By performing the implants at an elevated temperature, lattice damage that may occur during the implantation process may be annealed out as it occurs. Accordingly, the crystal quality of the implanted region may be maintained, or even improved, during the implantation process.

After implantation of dopants into the substrate 110 to form the implanted channel layer 118, the implanted p-type region 114, the source and drain regions 113, 117, and the well region 142, an activation anneal may be performed at a temperature in a range of about 1400° C. to about 1700° C. for about 5 minutes to about 30 minutes. The p-type implants and the n-type implants may be annealed concurrently or separately. For example, in some embodiments, p-type dopants may be implanted and annealed to form the p-type region 114 and the well region 142. After annealing the p-type portions, n-type dopants may be implanted and annealed to form the implanted channel layer 118 and the source and drain regions 113. Following the activation anneal (or anneals), the implanted channel layer 118 may have excellent crystal quality. For example, the implanted channel layer 118 may have lattice damage that is below the threshold at which the lattice damage may affect the mobility of the layer.

An insulator layer 120, such as an oxide, may be further provided on the exposed surface of the device to provide mechanical protection and electrical isolation to the exposed surface of the device, as well as to passivate unterminated chemical bonds on the surfaces of the semiconductor layers.

Although the present invention is described above with respect to particular MESFETs having particular layers, regions and recesses, it will be understood that embodiments of the present invention are not limited to the above described MESFETs. A p-type and n-type conductivity regions beneath the source region of according to embodiments of the present invention may be incorporated in to other types of transistors. For example, the p-type conductivity region according to embodiments of the present invention may be incorporated into MESFETs described in commonly assigned U.S. Pat. No. 6,686,616 entitled Silicon Carbide Metal Semiconductor Field Effect Transistors to Allen et al., the disclosure of which is hereby incorporated herein by reference as if set forth in its entirety.

Although the present invention is described above with reference to SiC MESFETs, the present invention is not limited to SiC MESFETs. For example, MESFETs according to embodiments of the present invention may be, for example, gallium arsenide (GaAs) MESFETs or Gallium Nitride (GaN) MESFETs. In particular, if the present invention were described with respect to GaAs MESFETs, the p-type conductivity regions might be p-type conductivity GaAs regions, the n-type conductivity channel layers might be n-type conductivity GaAs layers and the like. Furthermore, MESFETs according to some embodiments of the present invention may be, for example, SiC MESFET MMICs, GaN HEMTs, GaN HEMT MMICs, GaAs MESFETs, GaAs MESFET MMICs, GaAs HEMTs, GaAs HEMT MMICs, GaAs pHEMTs, GaAs pHEMT MMICs and the like.

Transistors according to some embodiments of the present invention may be useful in, for example, high efficiency linear power amplifiers, such as power amplifiers for base stations using complex modulation schemes such as code division multiple access (CDMA) and/or Wideband CDMA (WCDMA).

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A unit cell of a metal-semiconductor field-effect transistor (MESFET), comprising:
    a semi-insulating substrate having a surface;
    an n-type channel region beneath and spaced apart from the surface of the substrate wherein a semi-insulating portion of the semi-insulating substrate is between the channel region and the surface of the semi-insulating substrate;
    source and drain regions extending from the surface of the substrate into the channel region;
    a gate contact between the source and the drain regions; and
    a p-type region beneath the source region and having an end that extends towards the drain region, the p-type region being spaced apart vertically from the channel region and being electrically coupled to the source region.

2. The MESFET of claim 1, wherein the p-type region comprises boron and/or aluminum having a dopant concentration of from about $1.0 \times 10^{18}$ cm$^{-3}$ to about $1.0 \times 10^{20}$ cm$^{-3}$.

3. The MESFET of claim 1, wherein the p-type region has a peak concentration at a depth of from about 0.3 µm to 0.8 µm beneath the surface of the substrate.

4. The MESFET of claim 1, wherein the p-type region is spaced apart vertically from the channel region by a distance of about 0.1 µm to about 0.5 µm.

5. The MESFET of claim 1, further comprising an p-type well region extending from the surface of the substrate to the p-type region.

6. The MESFET of claim 1, wherein the gate has a first sidewall and a second sidewall, the first sidewall being on the source side of the gate and the second sidewall being on the drain side of the gate and wherein the p-type region extends from beneath the source to the first sidewall of the gate without extending past the first sidewall of the gate.

7. The MESFET of claim 1, wherein the gate has a first sidewall and a second sidewall, the first sidewall being on the source side of the gate and the second sidewall being on the drain side of the gate and wherein the p-type region extends from beneath the source to within about 0.1 to about 0.3 µm of the first sidewall on the source side of the first sidewall.

8. The MESFET of claim 1, wherein the gate has a first sidewall and a second sidewall, the first sidewall being on the source side of the gate and the second sidewall being on the drain side of the gate and wherein the p-type region extends from beneath the source to the second sidewall of the gate without extending past the second sidewall of the gate.

9. The MESFET of claim 1, wherein the gate has a first sidewall and a second sidewall, the first sidewall being on the source side of the gate and the second sidewall being on the drain side of the gate and wherein the p-type region extends from beneath the source to between the first and second sidewalls of the gate.

10. The MESFET of claim 1, wherein the p-type region extends from beneath a source contact and/or the source region without extending to beneath a drain contact.

11. The MESFET of claim 1, wherein the p-type region extends from beneath a source contact and/or the source region without extending to beneath a drain implant region.

12. The MESFET of claim 1, wherein the substrate comprises a silicon carbide (SiC) substrate, the p-type region being in the SiC substrate.

13. The MESFET of claim 12, wherein the n-type conductivity channel region comprises:
    a first n-type conductivity channel layer having a first dopant concentration;
    a second n-type conductivity channel layer having a second dopant concentration; and
    a third n-type conductivity channel layer having a third dopant concentration and being disposed between the first and second n-type conductivity channel layers;
    wherein the third dopant concentration is less than the first and second dopant concentrations.

14. The MESFET of claim 12, wherein the substrate comprises a high purity semi-insulating (HPSI) SiC substrate.

15. The MESFET of claim 12, wherein the channel region comprises a first n-type conductivity channel layer having a first dopant concentration and a second n-type conductivity channel layer on the first n-type conductivity channel layer and having a second dopant concentration, wherein the first n-type conductivity channel layer is between the second n-type conductivity channel layer and the p-type region, and wherein the first dopant concentration is greater than the second dopant concentration.

16. The MESFET of claim 15, wherein the first n-type conductivity channel layer has a dopant concentration of about 3×10$^{18}$ cm$^{-3}$ and wherein the second n-type conductivity channel layer has a dopant concentration of about 1×10$^{16}$ cm$^{-3}$.

17. The MESFET of claim 16, wherein the first n-type conductivity channel layer has a thickness of about 0.28 μm and the second n-type conductivity channel layer has a thickness of about 900 Å.

18. The MESFET of claim 1, wherein the substrate comprises at least one of n-type conductivity gallium arsenide (GaAs) and n-type conductivity gallium nitride (GaN), wherein the n-type conductivity channel layer comprises at least one of n-type conductivity GaAs and n-type conductivity GaN, and wherein the p-type region comprises at least one of p-type conductivity GaAs and p-type conductivity GaN.

19. The MESFET of claim 1, further comprising:
source and drain ohmic contacts on the source and drain regions, respectively; and
a recess between the source and drain regions that extends into the channel region, the gate being disposed in the recess and extending into the channel region.

20. The MESFET of claim 19, further comprising:
a p-type well region extending from the surface of the substrate to the p-type region;
an ohmic contact on the p-type well region; and
a first overlayer on the drain ohmic contact and a second overlayer on the source ohmic contact and the ohmic contact on the p-type well region, respectively, wherein the second overlayer electrically couples the source ohmic contact and the ohmic contact on the p-type well region.

21. The MESFET of claim 20, wherein the source and drain regions have dopant concentrations greater than a dopant concentration of the channel region.

22. The MESFET of claim 21, wherein the source and drain regions have dopant concentrations of about 1×10$^{19}$ cm$^{-3}$.

23. The MESFET of to claim 21, wherein the source and drain contacts comprise nickel contacts.

24. The MESFET of claim 1, further comprising:
first and second ohmic contacts on the source and drain regions, respectively;
a first recess between the source region and the drain region that exposes the n-type channel region, the first recess having first and second sidewalls;
a second recess disposed between the first and second sidewalls of the first recess and extending into the n-type channel region, wherein the gate contact is in the second recess;
a p-type well region extending from the surface of the substrate to the p-type region; and
a third ohmic contact on the p-type well region.

25. The MESFET of claim 24, wherein the n-type channel region comprises first and second n-type conductivity channel layers, wherein the first recess extends through the first n-type conductivity channel layer to the second n-type conductivity channel layer and exposes the second n-type conductivity channel layer and wherein the second recess extends into the second n-type conductivity channel layer.

26. The MESFET of claim 25, wherein the second recess extends about 600 Å into the second n-type conductivity channel layer.

27. The MESFET of claim 1, wherein the gate has a length from about 0.4 μm to about 0.7 μm.

28. The MESFET of claim 1, wherein a distance from the source to the gate is from about 0.5 μM to about 0.7 μm.

29. The MESFET of claim 1, wherein a distance from the drain to the gate is from about 1.5 μm to about 2 μm.

30. A MESFET comprising a plurality of unit cells according to claim 1, wherein a distance from a first gate to a second gate is from about 20 μm to about 50 μm.

31. The MESFET of claim 1, wherein portions of the semi-insulating substrate are between the n-type channel region and the surface of the semi-insulating substrate.

32. The MESFET of claim 1, wherein the p-type region is buried within the semi-insulating substrate.

33. The MESFET of claim 1, wherein portions of the semi-insulating substrate are between the p-type region and the n-type channel region.

34. The MESFET of claim 1, wherein the source and drain regions extend into the semi-insulating substrate to contact the n-type channel region.

35. The MESFET of claim 1, wherein the p-type region comprises an implanted region in the semi-insulating substrate.

36. A metal-semiconductor field-effect transistor (MESFET), comprising:
a semi-insulating layer having a surface;
a buried n-type channel region beneath and spaced apart from the surface of the semi-insulating layer wherein a semi-insulating portion of the semi-insulating layer is between the channel region and the surface of the semi-insulating layer;
source and drain regions extending from the surface of the semi-insulating layer into the buried channel region;
a gate contact between the source and the drain regions;
a p-type region beneath the source region and having an end that extends beneath the channel region towards the drain region, the p-type region being spaced apart vertically from the channel region;
a source contact on the source region; and
a conductive region that electrically connects the source contact and the p-type region.

37. The transistor of claim 36, wherein portions of the semi-insulating substrate are between the n-type channel region and the surface of the semi-insulating substrate.

38. The transistor of claim 36, wherein the p-type region is buried within the semi-insulating substrate.

39. The transistor of claim 36, wherein portions of the semi-insulating substrate are between the p-type region and the n-type channel region.

40. The transistor of claim 36, wherein the source and drain regions extend into the semi-insulating substrate to contact the n-type channel region.

41. The transistor of claim 36, wherein the p-type region comprises an implanted region in the semi-insulating substrate.

42. A transistor, comprising:
a semi-insulating layer having a surface;
a buried n-type channel region beneath and spaced apart from the surface of the semi-insulating layer wherein a semi-insulating portion of the semi-insulating layer is between the channel region and the surface of the semi-insulating layer;
spaced apart source and drain regions contacting the buried channel region;
a gate contact between the source and the drain regions; and
a p-type region beneath the source region that extends beneath the channel region towards the drain region, the p-type region being spaced apart vertically from the channel region;
wherein the source region and the p-type region are electrically connected.

* * * * *

UNITED STATES PATENT AND TRADEMARK OFFICE
CERTIFICATE OF CORRECTION

| | | |
|---|---|---|
| PATENT NO. | : 7,880,172 B2 | Page 1 of 1 |
| APPLICATION NO. | : 11/700268 | |
| DATED | : February 1, 2011 | |
| INVENTOR(S) | : Henning et al. | |

It is certified that error appears in the above-identified patent and that said Letters Patent is hereby corrected as shown below:

In the Claims:
Column 17, Claim 28, Line 64: Please correct "0.5µM" to read -- 0.5µm --

Signed and Sealed this
Fifth Day of July, 2011

David J. Kappos
*Director of the United States Patent and Trademark Office*